United States Patent
Chao et al.

(10) Patent No.: US 10,176,276 B2
(45) Date of Patent: Jan. 8, 2019

(54) DETERMINING AN OPTIMAL GLOBAL QUANTUM FOR AN EVENT-DRIVEN SIMULATION

(75) Inventors: Qizhang Chao, Palo Alto, CA (US); Neeti K. Bhatnagar, San Jose, CA (US); George F. Frazier, Lawrence, KS (US); Tuay-Ling Kathy Lang, Boxborough, MA (US); Andrew Wilmot, Carlisle, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 783 days.

(21) Appl. No.: 13/604,213

(22) Filed: Sep. 5, 2012

(65) Prior Publication Data

US 2014/0067358 A1    Mar. 6, 2014

(51) Int. Cl.
*G06F 17/50* (2006.01)

(52) U.S. Cl.
CPC ................ *G06F 17/5009* (2013.01)

(58) Field of Classification Search
CPC .................................. G06F 17/5009
See application file for complete search history.

(56) References Cited

U.S. PATENT DOCUMENTS

| | | | |
|---|---|---|---|
| 7,203,632 B2* | 4/2007 | Milne et al. | 703/14 |
| 8,126,696 B1* | 2/2012 | Faraboschi et al. | 703/21 |
| 8,620,629 B1* | 12/2013 | Li et al. | 703/2 |
| 2004/0024578 A1* | 2/2004 | Szymanski et al. | 703/17 |
| 2006/0036426 A1* | 2/2006 | Barr et al. | 703/22 |
| 2006/0149526 A1* | 7/2006 | Torossian et al. | 703/16 |
| 2008/0091403 A1* | 4/2008 | Harrison et al. | 703/17 |
| 2008/0243464 A1* | 10/2008 | Calvez | 703/17 |
| 2009/0187395 A1* | 7/2009 | Manohar et al. | 703/17 |
| 2010/0107168 A1* | 4/2010 | Auerbach et al. | 718/103 |
| 2011/0035204 A1* | 2/2011 | Smirnov et al. | 703/14 |
| 2011/0161066 A1* | 6/2011 | Kakkar et al. | 703/15 |

(Continued)

OTHER PUBLICATIONS

R.M. Fujimoto, "Parallel discrete event simulation," Communications of the ACM Magazine, Special issue on simulation, vol. 33, Issue 10, Oct. 1990, pp. 30-53.*

(Continued)

*Primary Examiner* — Aniss Chad
(74) *Attorney, Agent, or Firm* — Mark H. Whittenberger, Esq.; Holland & Knight LLP

(57) ABSTRACT

An apparatus and method for determining an optimal global quantum value for use in event-driven simulations of a device are disclosed herein. The device is simulated using information representative of a device design corresponding to the device, the simulation of the device comprising an event-driven simulation using a provisional global quantum value. Events included in a sequence chart corresponding to the simulation using the provisional global quantum value are compared against expected events. Based on the comparison detecting at least one of the expected events being absent in the sequence chart, providing the optimal global quantum value as being smaller than the provisional global quantum value. Based on the comparison detecting no difference between the events in the sequence chart and the expected events, providing the optimal global quantum value as being larger than the provisional global quantum value.

24 Claims, 10 Drawing Sheets

(56) References Cited

U.S. PATENT DOCUMENTS

2011/0227925 A1* 9/2011 De Pauw .............. G06F 11/323
 345/440
2012/0005640 A1* 1/2012 Mehta ........................... 716/106
2013/0018644 A1* 1/2013 Motel et al. .................... 703/14

OTHER PUBLICATIONS

R.M. Fujimoto, "Parallel discrete event simulation," Proceedings of the 1989 Winter Simulation Conference. pp. 19-28.*
M.D. Bumble, "A Parallel Architecture for Non-deterministic Discrete Event Simulation," A Thesis in Computer Science and Engineering, The Pennsylvania State University, May 2001, 285 pages.*
M. Glinz et al., "Simulation-Driven Creation, Validation and Evolution of Behavioral Requirements Models," Proceedings Dagstuhl-Workshop Modellbasierte Entwicklung eingebetteter Systeme (MBEES 2007), 2007, pp. 103-112.*
D. Jagtap et al., "Optimization of Parallel Discrete Event Simulator for Multi-Core Systems," IEEE 26th International Parallel & Distributed Processing Symposium (IPDPS), May 21-25, 2012, pp. 520-531.*
R.C. De Vries, "Reducing Null Discrete Messages in Misra's Distributed Discrete Event Simulation Method," IEEE Transactions on Software Engineering, vol. 16, No. 1, January 1990, pp. 82-91.*
Fujimoto, "Parallel Discrete Event Simulation", Communications of the ACM—Special issue on simulation, vol. 33, Issue 10, Oct. 1990, pp. 30-53.*
Varga et al., "An overview of the OMNeT++ simulation environment", Proceedings of the 1st international conference on Simulation tools and techniques for communications, networks and systems & workshops, Mar. 2008, 10 pages.*

* cited by examiner

DETERMINING AN OPTIMAL GLOBAL QUANTUM FOR AN EVENT-DRIVEN SIMULATION

BACKGROUND

The present invention relates to the field of simulations. More particularly, the present invention relates to even-driven simulations.

Simulations are used to model physical devices to facilitate device design, prototyping, and/or testing. A computer runs simulations by executing a set of instructions or code representative of the modeled device and the functionalities of and the interactions between components comprising the modeled device. A modeled device may comprise an integrated circuit (IC), one or more components on an integrated chip (e.g., resister, transistor, processor, bus, memory, clock, etc.), the entire integrated chip, a system including one or more ICs and/or integrated chips (e.g., smartphones), and the like.

In an event-driven simulation environment, the operation of a modeled device is represented as a chronological sequence of events. Because one event may trigger the execution of another event, events can be deemed to occur at particular points on a timeline. The timeline is represented as discretely increasing time values during a simulation. A system clock defines the advancement of the time value, thereby specifying the current time value throughout the simulation. Nevertheless within a temporally decoupled simulation environment, execution of events need not be limited by the current time value. Instead, one or more events may be allowed to execute ahead of the current system clock time (e.g., simulating future events at the current time). The maximum amount of time that events can be executed ahead of the system clock time is referred to as a quantum or global quantum. While having a large global quantum increases the simulation speed, it also increases the chance of incorrect simulation results. An event executed ahead of the current system clock time may cause an event trigger to be missed or to trigger at an improper time. This can have a ripple effect throughout the rest of the simulation. Conversely, using a small global quantum increases the probability of obtaining accurate simulation results at the expense of an unduly long simulation time. The selection of the global quantum is thus not trivial.

Presently the global quantum value is set by trial and error or by taking an educated guess (using specific information about simulation components within the to-be modeled device). In cases where a too large global quantum is used, it may not even be apparent that the corresponding simulation results are incorrect due to the particular choice of global quantum. Thus, it would be beneficial to provide a mechanism to systematically determine an optimal global quantum value for a given modeled device that maximizes simulation speed without introducing simulation errors. It would also be beneficial to have feedback other than whether the simulation results are correct or not in connection with the chosen global quantum value.

BRIEF SUMMARY

An apparatus and method for determining an optimal global quantum value for use in event-driven simulations of a device are disclosed herein. The method includes simulating the device using information representative of a device design corresponding to the device, the simulation of the device comprising an event-driven simulation using a provisional global quantum value. The method further includes comparing events included in a sequence chart corresponding to the simulation using the provisional global quantum value against expected events. Based on the comparison detecting at least one of the expected events being absent in the sequence chart, providing the optimal global quantum value as being smaller than the provisional global quantum value. Based on the comparison detecting no difference between the events of the sequence chart and the expected events, providing the optimal global quantum value as being larger than the provisional global quantum value. Repeating the simulation and the comparison for each iteration of a change in the provisional global quantum value to determine the optimal global quantum value.

Other features and aspects of the invention will become apparent from the following detailed description, taken in conjunction with the accompanying drawings which illustrate, by way of example, the features in accordance with the embodiments.

BRIEF DESCRIPTION OF THE DRAWINGS

Some embodiments are illustrated by way of example and not limitations in the figures of the accompanying drawings, in which.

Figure 1:
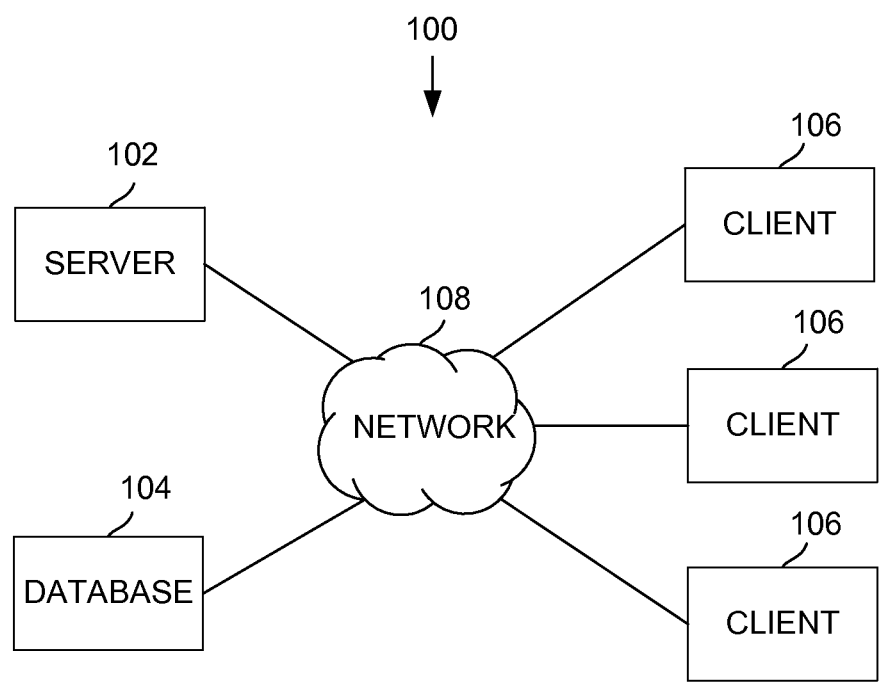
FIG. 1 illustrates an example system for determining an optimal global quantum associated with simulating a given physical device according to some embodiments.

The headings provided herein are for convenience only and do not necessarily affect the scope or meaning of the terms used.

DETAILED DESCRIPTION

Described in detail below is an apparatus and method for determining an optimal global quantum value for use in event-driven simulations of a given device/system. The optimal global quantum value is selected to speed up the simulations without sacrificing accuracy of simulation results and values. In one embodiment, events shown in a sequence chart corresponding to an event-driven simulation with a provisional global quantum value are compared against expected events for the simulation to detect the absence of event(s) in the sequence chart. The absence of one or more events in the sequence chart indicates that the provisional global quantum value is too large, while the presence of all the expected events in the sequence chart is indicative of the provisional global quantum value being sufficient or that it may be slightly increased. One or more such iterations, each with a different provisional global quantum value, are performed to narrow down to the optimal global quantum value for the given device/system. The detection of the optimal global quantum value is performed without relying on the accuracy of the simulation results and values as the indicator.

Various modifications to the embodiments will be readily apparent to those skilled in the art, and the generic principles defined herein may be applied to other embodiments and applications without departing from the scope of the invention. Moreover, in the following description, numerous details are set forth for the purpose of explanation. However, one of ordinary skill in the art will realize that embodiments of the invention may be practiced without the use of these specific details. In other instances, well-known structures and processes are not shown in block diagram form in order not to obscure the description of the invention with unnecessary detail. Thus, the present disclosure is not intended to be limited to the embodiments shown, but is to be accorded the widest scope consistent with the principles and features disclosed herein.

Simulations are used to model physical devices to facilitate device design, prototyping, and/or testing. A computing system runs simulations by executing a set of instructions or code representative of the modeled device and the functionalities of and the interactions between components comprising the modeled device. An integrated circuit (IC), one or more components on an integrated chip (e.g., resister, transistor, processor, bus, memory, clock, etc.), the entire integrated chip, a device including one or more ICs and/or integrated chips (e.g., smartphones, mobile devices), and the like are example devices that can be modeled and their behavior and properties simulated within a simulation environment.

In an event-driven simulation environment, the operation of a modeled device is represented as a chronological sequence of events. Because one event may trigger the execution of another event, events can be deemed to occur at particular points on a timeline. The timeline is represented as discretely increasing time values during a simulation. A system clock defines the advancement of the time value, thereby specifying the current time value throughout the simulation. Nevertheless within an event-driven simulation environment that features temporal decoupling, execution of events of a sub-system need not be limited by the current time value. Instead, one or more events may be allowed to execute ahead of the current system clock time (e.g., simulating future events at the current time). The maximum amount of time that events of any sub-system can be executed ahead of the system clock time is referred to as a global quantum (also referred to as GQ, quantum, or global quantum value).

Using a large global quantum value increases the simulation speed but simulation accuracy may be diminished. Conversely, use of a small global quantum value decreases the simulation speed but increases the likelihood that a simulation will accurately model a device (e.g., events trigger at the correct time and in the correct order relative to each other). The determination of an optimal global quantum value and corresponding simulation environment are implemented by the system of FIG. 1.

FIG. 1 illustrates an example system 100 for determining an optimal global quantum associated with simulating a given physical device according to some embodiments. System 100 includes a server 102, a database 104, one or more clients 106, and a network 108. Each of server 102, database 104, and clients 106 is in communication with network 108.

Server 102 comprises one or more computers or processors configured to communicate with clients 106 via network 108. Server 102 may be located at one or more geographically distributed locations. Server 102 hosts one or more applications accessed by clients 106 and/or facilitates access to the contents of database 104. Database 104 comprises one or more databases configured to communicate with server 102 and/or clients 106 via network 108. Although not shown, database 104 may also communicate with server 102 without needing network 108. Database 104 may be located at one or more geographically distributed locations from each other and also from server 102. Alternatively, database 104 may be included within server 102. Database 104 comprises a storage device for storing data and/or instructions for use by server 102 and/or clients 106.

Each of clients 106 comprises a computer or other computing device, including but not limited to, work stations, personal computers, general purpose computers, Internet appliances, hand-held devices, wireless devices, portable devices, wearable computers, cellular or mobile phones, portable digital assistants (PDAs), smart phones, multi-processor systems, microprocessor-based or programmable consumer electronics, game consoles, set-top boxes, network PCs, mini-computers, and the like. Clients 106 include applications (e.g., web browser application such as Chrome, Internet Explorer, Firefox, Safari, etc.) or other necessary interface capabilities to communicate with server 102 and database 104 via network 108. Clients 106 may be located geographically dispersed from each other, server 102, and/or database 104. Although three clients 106 are shown in FIG. 1, more or less than three clients may be included in system 100.

Network 108 comprises a communications network, such as a local area network (LAN), a wireless LAN (WLAN), a wide area network (WAN), a wireless WAN (WWAN), a metropolitan area network (MAN), an ad hoc network, an intranet, an extranet, a virtual private network (VPN), a portion of the Internet, the Internet, a portion of a public switched telephone network (PSTN), a cellular network, or a combination of two or more such networks. When network 108 comprises a public network, security features (e.g., VPN/SSL secure transport) may be included to ensure authorized access within system 100.

The simulation environment capable of determining the optimal global quantum values (also referred to as a global quantum tool or global quantum optimization tool) may be hosted by one or more components within system 100. The simulation environment comprises an event-driven simulation environment, as example of which is described by the Open SystemC Initiative (OSCI) SystemC Transaction-level Modeling Standard, TLM-2.0. In one embodiment, the global quantum optimization tool is hosted on server 102 and is remotely accessed by clients 106 via network 108. In another embodiment, the tool resides locally on clients 106. Server 102 may be involved for purposes of updating and/or monitoring the tool on clients 106, and/or to facilitate interaction with database 104 by clients 106. In still another embodiment, a portion of the tool may reside at server 102 and another portion of the tool may reside at clients 106.

Alternatively, clients 106 may be standalone stations not connected to a network. In this case, database 104 (or similar functionality) may be included in clients 106 to provide information used by the tool, as described in detail below. In yet another alternative, the tool may be implemented on a peer-to-peer network rather than the server-client architecture shown in FIG. 1.

In one embodiment, the global quantum optimization determination is implemented as part of a larger simulator (a simulation product or service) that is capable of running at least event-driven simulations. In another embodiment, the global quantum optimization determination is implemented as a tool separate from the simulator itself. In this case the tool includes code to model the device of interest (or is otherwise able to obtain the modeling information from another source such as the simulator) and/or other information necessary to pick out the optimal global quantum value for the device of interest.

Figure 2:
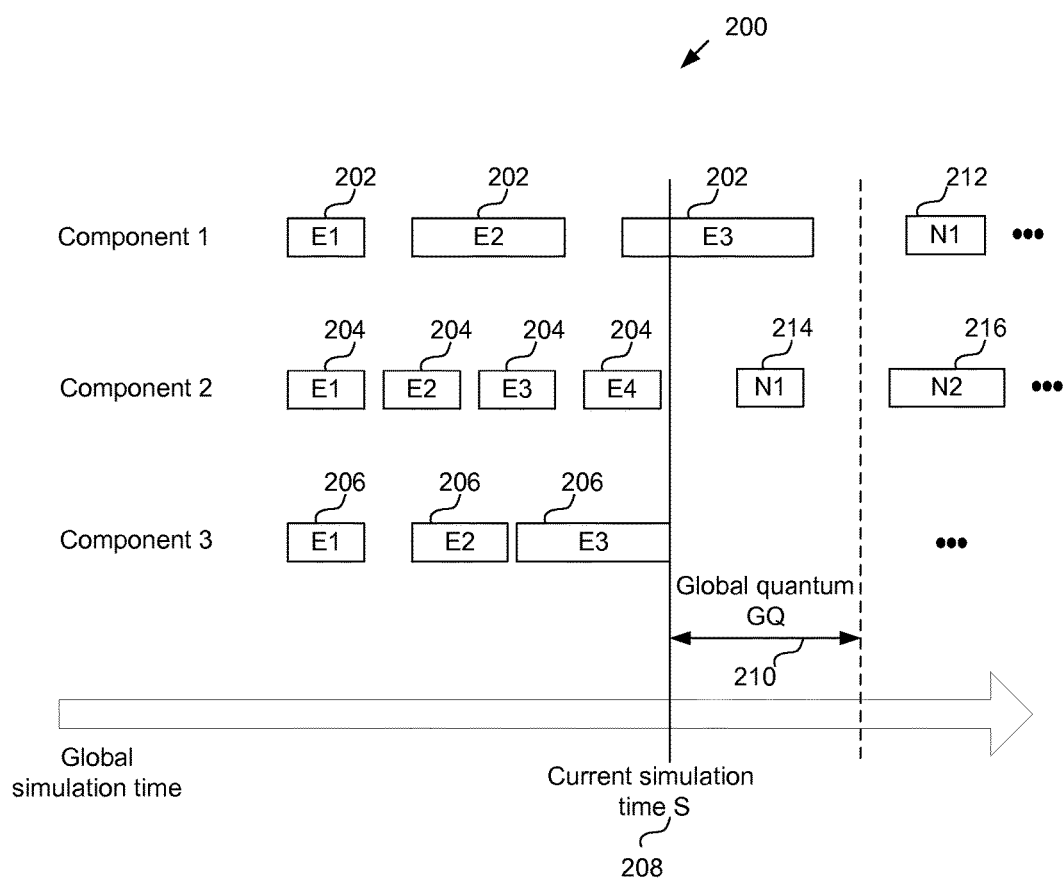
FIG. 2 illustrates an example sequence chart that plots executed events and events to be executed against an axis of time for a plurality of components during an event-driven simulation according to some embodiments.

FIG. 2 illustrates an example sequence chart 200 that plots executed events and events to be executed against an axis of time for a plurality of components during an event-driven simulation according to some embodiments. Each event shown in FIG. 2 is associated with a particular component representative of a portion of the device being simulated. A simulated device can be represented as a plurality of (simulation) components such as, but not limited to, one or more processors, central processing units (CPUs), universal asynchronous receiver/transmitters (UARTs), terminal emulators (TTYs), peripheral electronic components, memories, system buses, and the like. Not all of the components may execute events that are shown in the sequence chart 200, although the simulator simulates all of the components to accurately model the device. For example, the system bus component(s) are not shown in the sequence chart 200 even though all of the other components may be connected to the system bus component(s).

Event-driven simulators, such as those configured in accordance with the OSCI TLM 2.0 standard, allow each of one or more simulation components of the modeled device to maintain a local clock value that runs ahead of or temporally decouples from a global system clock value. The global system clock value is also referred to as a simulation time, master clock value, global clock value, or system clock value. Because there might not be an event for each discrete "tick" of the global system clock, the global system clock may be allowed to "hop"—move to the next time value for which there will be an event execution. A fast component (e.g., a processor) may operate significantly faster than slower components (e.g., peripheral components); and thus, the fast component is allowed to "run ahead" of the current simulation time value up to a certain time period or when it reaches the point at which it needs to synchronize with the rest of the system. Then the fast component yields control to slower components to execute events and allow the current simulation time to advance to equal the fast component's local clock value. Such "running ahead" does not alter simulation results—while speeding up the overall simulation—because the slower components are not able to execute events frequently enough to change simulation results, as long as the fast component does not run ahead too far. The time interval value that serves as the maximum time the fast components will be allowed to run ahead is governed by a time value called the global quantum. The global quantum value is known to all components of the simulation environment.

The components shown in FIG. 2—Component 1, Component 2, and Component 3—are part of a simulated device/ system. In one embodiment, the components of FIG. 2 are associated with a virtual platform. A virtual platform comprises a simulation environment that models a system that contains one or more processors that read and write from one or more memory subsystems. The virtual platform can also contain peripheral electronic components such as a UART, TTY, and the like. All of these components can be connected to one or more system buses. The virtual platform may also run software.

Component 1 executes a plurality of events 202 in order of E1, E2, and then E3. Component 2 executes a plurality of events 204 in order of E1, E2, E3, and then E4. Component 3 executes a plurality of events 206 in order of E1, E2, and then E3. Component 1 has an event (E3) that runs ahead of a current simulation time S 208. However, event E3 of component 1 does not exceed S+GQ time, the current simulation time S 208 plus a global quantum time period GQ 210. For example, component 1 may be a fast component, such as a processor or CPU, and components 2 and 3 may be slower components, such as peripheral components. Sequence chart 200 also shows future events to be executed and their proper execution times (e.g., event notifications): future event N1 212 to be executed by component 1, future event N1 214 to be executed by component 2, and future event N2 216 to be executed by component 2.

Figure 3:
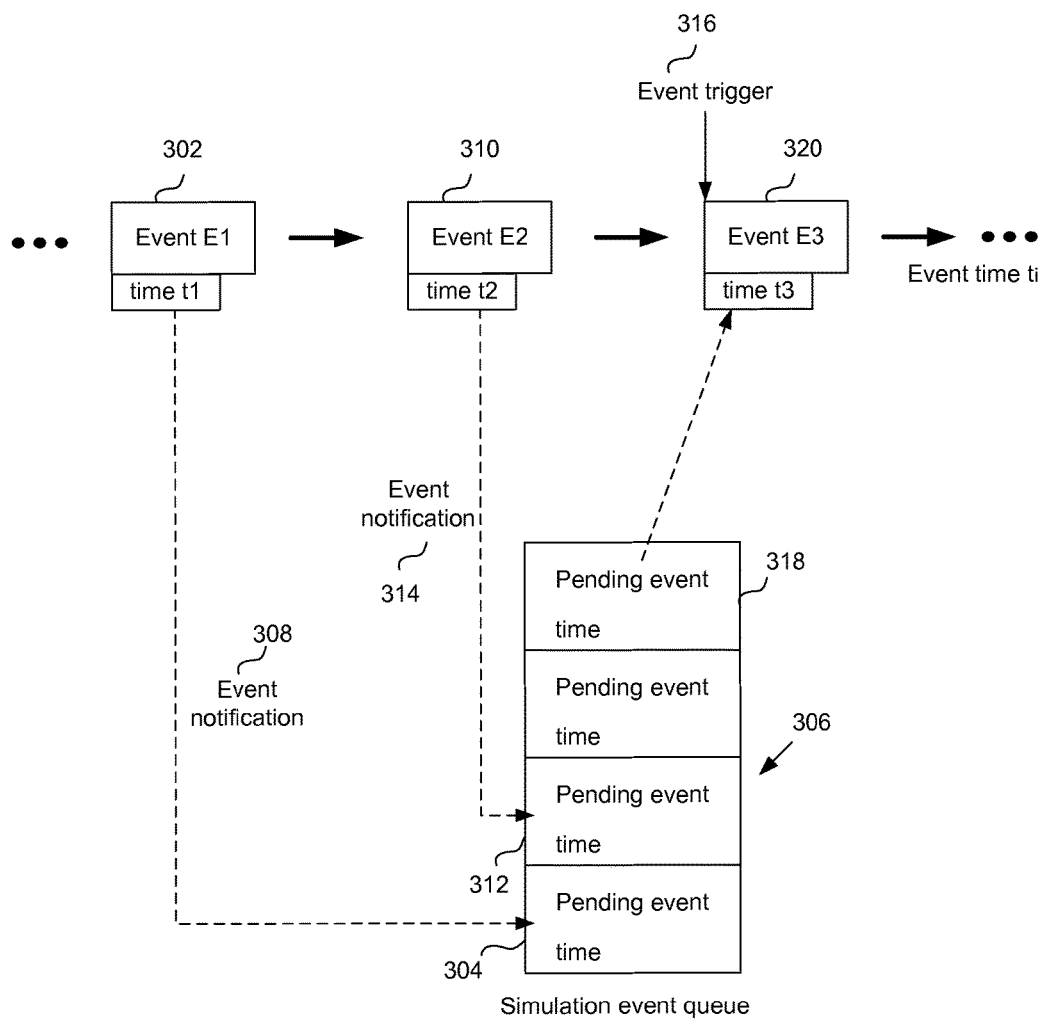
FIG. 3 illustrates a diagram showing the interoperability of events in a simulation environment, such as a virtual platform, according to some embodiments.

FIG. 3 illustrates a diagram showing the interoperability of events in a simulation environment, such as a virtual platform, according to some embodiments. An event E1 302 is executed by a component at a time t1. The execution of event E1 302 triggers creation of a new pending event 304 having a certain execution time. The new pending event 304 represents a future event N, such as future event N1 212 or future event N2 216 in FIG. 2. The newly created pending event 304 is added to a simulation event queue 306, the addition of the pending event 304 to the simulation event queue 306 referred to as an event notification 308.

At a time later than time t1, an event E2 310 is executed by a component at a time t2. The execution of event E2 310 triggers creation of a new pending event 312 having a certain execution time. The newly created pending event 312 is added to the simulation event queue 306, denoted by an event notification 314. Again, pending event 312 represents a future event N, such as future event N1 212 or future event N2 216 in FIG. 2. When the simulation time advances to the earliest time at which a pending event (future event) should be executed, those pending event(s) are executed at that time. A pending event starting to execute is referred to as an event trigger. FIG. 3 shows an event trigger 316 corresponding to a pending event 318 included in the simulation event queue 306. The pending event 318 comes off the simulation event queue 306 and executes as an event E3 320 at a time t3.

Each of the events E1 302, E2 310, and E3 320 may be executed by the same or different component from each other. A first component may create one or more pending events to be executed by one or more of a second component, third component, etc. Each of the times t1, t2, and t3 (also referred to as event times $t_j$) is as follows: $S+GQ >= t_j >= S$, where S=current simulation time and GQ=global quantum value. The event executions, event notifications, and event triggers associated with the components comprising a modeled device are thus simulated by the simulator in accordance with the current simulation time (e.g., current simulation time S 208) and a specified global quantum value (e.g., global quantum value GQ 210).

If the global quantum value is too large, event notifications (e.g., event notifications 308 or 314) can occur but the corresponding events may not trigger because some component does not yield control back to the scheduler of the event-driven simulator prior to or at the event trigger time. Alternatively, a component may not be able to add an event that should be added to the simulation event queue 306 prior to that event's trigger time, because such component lacks control to add the event to the simulation event queue 306. Missing even a single event execution at its proper time can cause a ripple effect that results in incorrect simulation results and values. By contrast, an optimal global quantum value using in the simulation of a given modeled device/system provides increased simulation speed without sacrificing simulation result accuracy.

Figure 4:
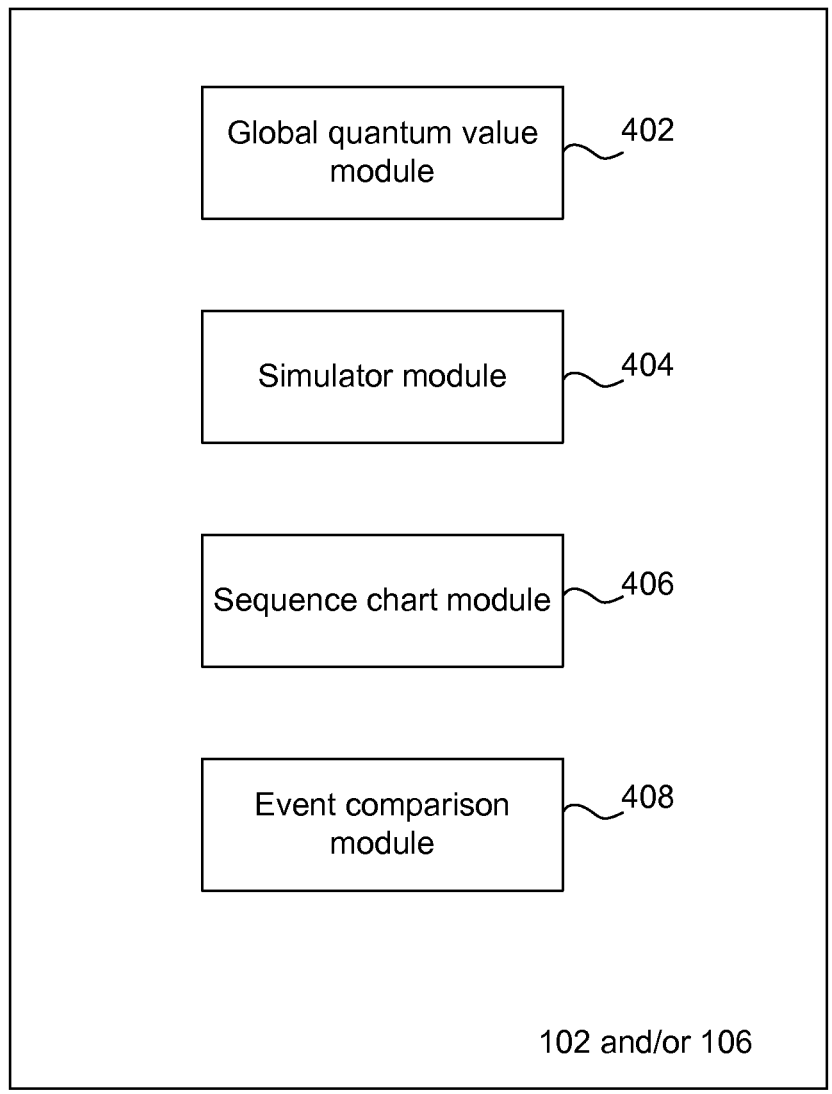
FIG. 4 illustrates a block diagram showing functionalities and operations associated with determining an optimal global quantum value to use in an event-driven simulation of a given device/system implemented in modules according to some embodiments.

FIG. 4 illustrates a block diagram showing functionalities and operations associated with determining an optimal global quantum value to use in an event-driven simulation of a given device/system implemented in modules according to some embodiments. The modules comprise one or more software components, programs, applications, apps, or other units of code base or instructions configured to be executed by one or more processors included in the server 102 and/or clients 106 to identify a suitable global quantum value as described herein. Although modules 402-408 are shown as distinct modules in FIG. 4, it should be understood that modules 402-408 may be implemented as fewer or more modules than illustrated. It should also be understood that any of modules 402-408 may communicate with one or more components included in the system 100, such as server 102, database 104, and/or clients 106. The modules include a global quantum value module 402, a simulator module 404, a sequence chart module 406, and an event comparison module 408. FIG. 4 is described below in conjunction with FIG. 5.

Figure 5:
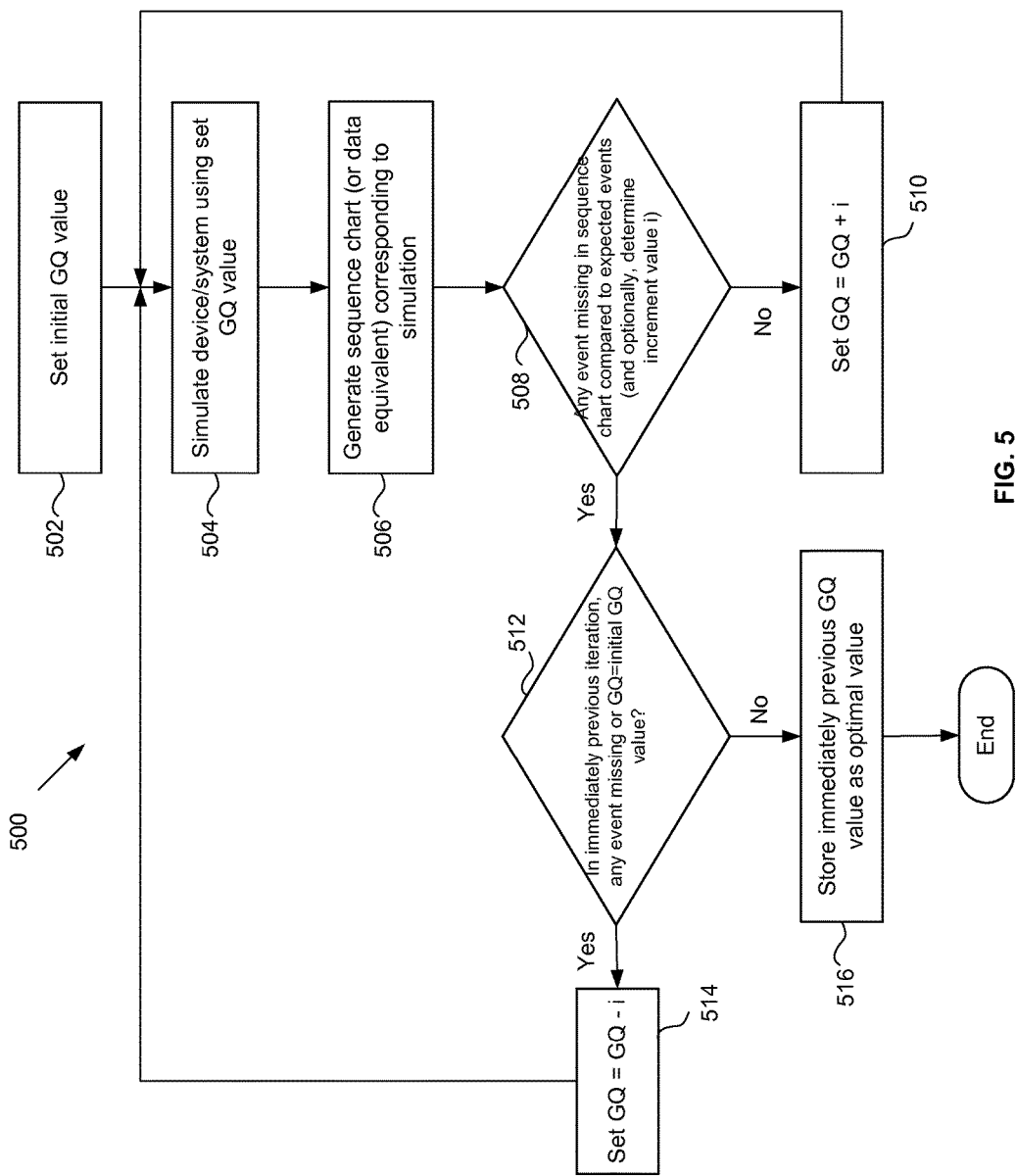
FIG. 5 illustrates an example flow diagram for determining an optimal global quantum value to use in an event-driven simulation of a given device/system (or virtual platform) according to some embodiments.

FIG. 5 illustrates an example flow diagram 500 for (iteratively) determining an optimal global quantum value to use in an event-driven simulation of a given device/system (or virtual platform) according to some embodiments. At a block 502, the global quantum value module 402 is configured to set an initial global quantum (GQ) value. GQ values during the iterative process are also referred to provisional GQ values. Next at a block 504, the simulator module 404 is configured to conduct an event-driven simulation of the given device/system using the set GQ value. As discussed above, the simulator functionalities and operations (e.g., the simulator module 404) may be part of or separate from the optimal global quantum value determination tool. In some embodiments, the simulator module 404 may be provided by existing event-driven simulator systems.

During and/or after the simulation at block 504, the sequence chart module 406 is configured to generate a sequence chart (similar to sequence chart 200 of FIG. 2) or obtain data that can be used to generate a sequence chart (referred to as sequence chart data equivalent) corresponding to the conducted simulation (block 506). Next at a block 508, the event comparison module 408 is configured to determine whether the sequence chart (or its data equivalent) from block 506 is missing any (executed and/or future) events in comparison to expected events. A missing event can comprise the absence of a particular event in the sequence chart and/or an event present in the sequence chart that is different in some way from the corresponding expected event. An event-driven simulation of the given device/system using a GQ value of zero—in other words, an event-driven simulation conducted without any components running ahead or temporally decoupling from the global simulation time—provides the expected events for the given device/system. Each of the expected events includes both the event itself and its proper execution time. A simulation of the given device/system using GQ of zero may be run prior to start of the flow diagram 500.

In some embodiments, the sequence chart in block 506 is generated upon completion of the simulation in block 504 (e.g., all events in the sequence chart should be executed events). Hence the comparison in block 508 comprises looking for whether at least one event that should have executed at a specific simulation time failed to execute accordingly or executed differently from its corresponding expected event. In other embodiments, the sequence chart in block 506 is generated and the comparison in block 508 commences while the simulation in block 504 is in progress (e.g., the sequence chart contains executed events and future/pending events). Then the comparison in block 508 comprises looking for at least one executed event or future/pending event in the sequence chart that is missing or differs from the expected events. If an event is missing/different, then the simulation in progress may be halted since there is nothing to be gained from completing the current simulation. The flow continues on the yes branch of block 508.

In some embodiments, a user may perform the comparison and detection of missing executed and/or future events using the sequence chart from block 506 and a sequence chart of expected events. The user can visually inspect the sequence charts to determine whether any event triggers is lost due to an incorrect global quantum value. Then the user can provide the comparison (detection) results for receipt by the event comparison module 408.

If no event is missing (the comparison detects no difference between the events of the sequence chart and the expected events) (no branch of block 508), then the current GQ value may be increased without having incorrect simulation results and values. The global quantum value module 402, at a block 510, sets the new GQ value=current GQ value+an increment i. Then the next iteration commences by returning to block 504. In some embodiments, the increment value i can be a pre-determined system value applicable for all devices/systems being simulated. In other embodiments, the increment value i can be specific to the given device/system. During the comparison in block 508, the event comparison module 408 and/or the global quantum value 402 determines an increment value i particular for the given device/system. One or more time intervals between respective one or more event notifications and event triggers in the sequence chart (or data equivalent) (from block 506) are used to determine possible global quantum values, and in turn, the increment value i.

Otherwise, if one or more executed or future events are missing in the current iteration (yes branch of block 508) due to a too large current GQ value. At a block 512, the event comparison module 408 checks whether any events were missing in the immediately previous iteration or whether the current GQ value is the initial GQ value. If either condition is true (yes branch of block 512), then the global quantum value module 402, at a block 514, sets the new GQ value=current GQ value−an increment i. The flow diagram 500 returns to block 504 for the next iteration. Otherwise the immediately previous iteration had no missing events (or event notifications) (no branch of block 512), and the optimal GQ value for the given device/system is identified. The global quantum value module 402 stores the immediately previous iteration GQ value as the optimal GQ value for the given device/system at a block 516.

Figure 6A:
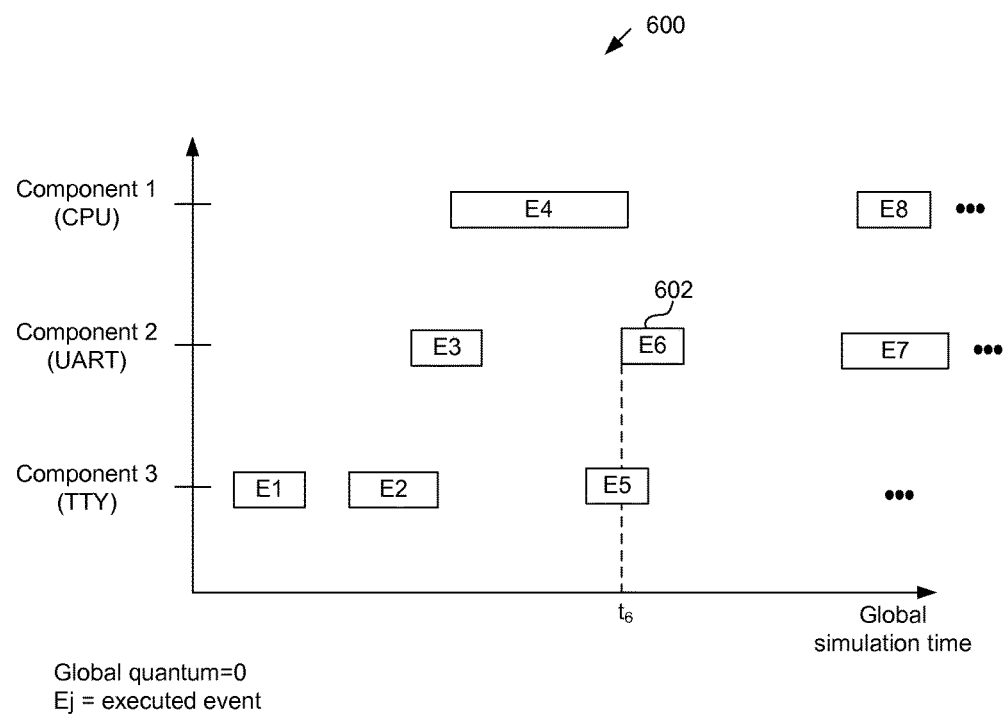
FIGS. 6A-6D illustrate example sequence charts with different global quantum values for a given device/system according to some embodiments.

FIGS. 6A-6D illustrate example sequence charts with different global quantum values for a given device/system including three components—Component 1 (e.g., CPU), Component 2 (e.g., UART), and Component 3 (e.g., TTY). FIG. 6A illustrates an example sequence chart 600 with a global quantum of zero. The sequence chart 600 shows all of the expected events during a proper simulation of the given device/system, which can be the basis for comparison against each iterative sequence chart in block 508 of FIG. 5. Sequence chart 600 shows a plurality of executed events (also referred to as event triggers) including event E6 602 executed by Component 2 at a particular simulation time t6.

Figure 6B:
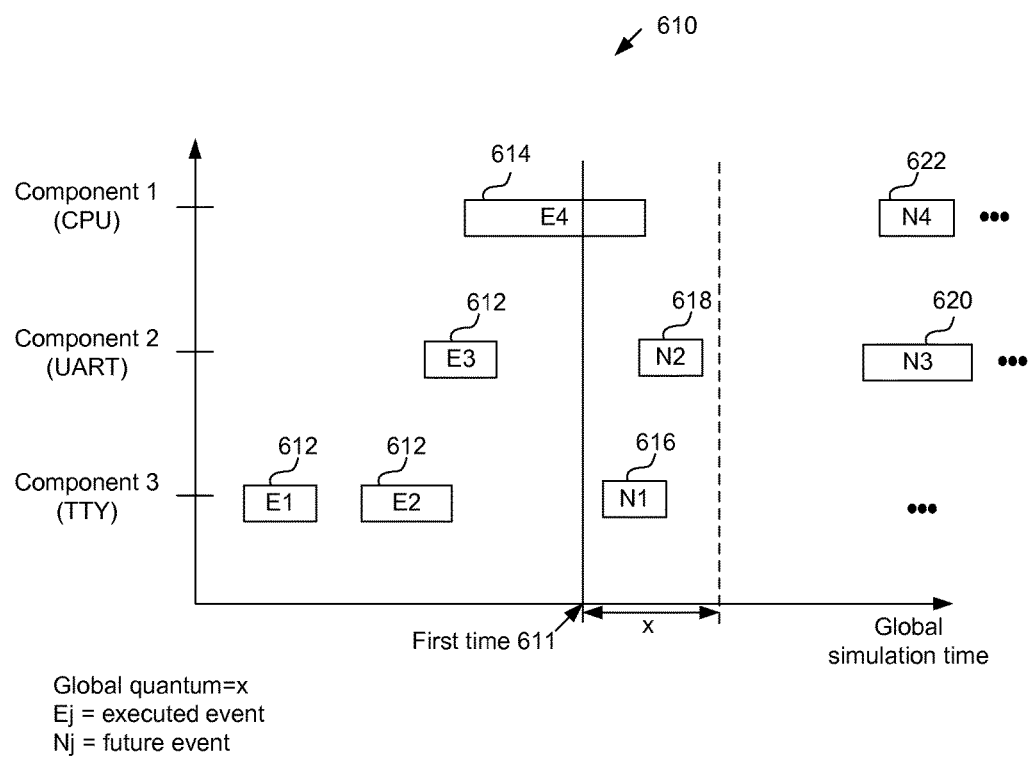

FIG. 6B illustrates an example sequence chart 610 with a global quantum value x at a first simulation time 611. When the global simulation clock is at the first simulation time 611 (the current simulation time), events E1, E2, and E3 (collectively events 612) have executed and event E4 614 of Component 1 has also executed by running ahead of the first current simulation time. All of the future events N1 616, N2 618, N3 620, and N4 622 have yet to execute because their event trigger times are later than the first current simulation time and their respective components are not capable of and/or not permitted to run ahead up to the global quantum x time period.

Figure 6C:
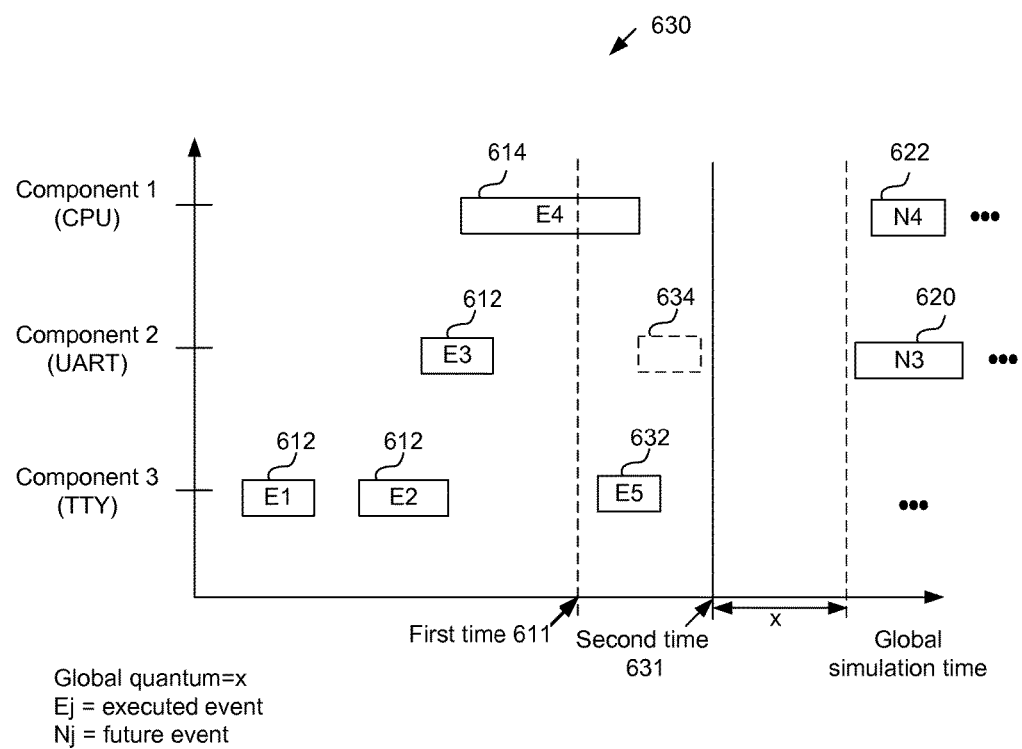

FIG. 6C illustrates an example sequence chart 630 with global quantum x where the simulation time has progressed from sequence chart 610—sequence chart 630 shows the current simulation time at a second simulation time 631. With the advancement of the current simulation time, future event N1 616 has executed into event E5 632. However, future event N2 618 in FIG. 6B has failed to convert into an event in FIG. 6C due to global quantum x being too large. At the time when Component 2 should have executed future event N2 618 to event E6 602 (FIG. 6A), the execution failed to occur, thus resulting in a missing event 634. As an example, sequence chart 630 may comprise a sequence chart generated in block 506 of FIG. 5 and sequence chart 600 of FIG. 6 may comprise the expected sequence chart (or sequence chart showing expected events). Sequence chart 600 may be used as the basis for comparison against sequence chart 630 in block 508 of FIG. 5. The comparison reveals that event E6 602 shown in sequence chart 600 is missing in sequence chart 630. Thus, the iteration process proceeds from the yes branch of block 508 to block 512.

Figure 6D:
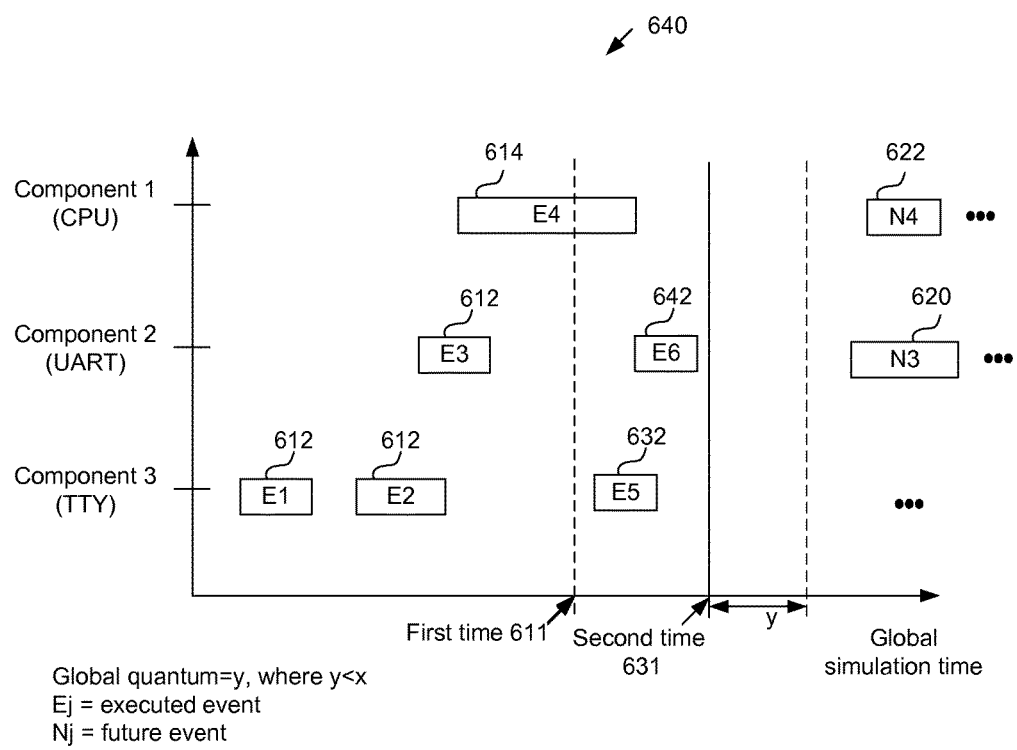

FIG. 6D illustrates an example sequence chart 640 with a global quantum value y, wherein y<x, at a current simulation time equal to the second simulation time 631. In contrast to sequence chart 630 of FIG. 6C, future event N2 618 properly converted to an event 642—event 642 corresponding to event 602 in FIG. 6A. Continuing the above example, sequence chart 640 may comprise a sequence chart generated in block 506 of FIG. 5 in an earlier iteration than sequence chart 630. Sequence chart 640 compared or inspected against sequence chart 600 shows no missing events. Thus, the no branch of block 508 is evoked and proceeds to block 510.

Accordingly, sequence charts that plot event notifications and event triggers in relation to simulation time are used to solve the problem of choosing a global quantum for use in the event-driven simulation of a given device/system, the global quantum selected to be as large as possible without causing incorrect simulation results. Sequence charts show the order of event notifications and triggers so that the cause and effect relationship of a global quantum value on the sequence of simulation events is visible. The sequence charts show all event activities to detect whether any particular global quantum value caused one or more expected event executions (event triggers) to not occur.

Use of sequence charts further permits detection of whether event notification(s) failed to occur because a component that ran ahead of the current simulation time hadn't yielded control (or processing resources) to other component(s) associated with generating event notification(s). Moreover, instead of relying on the incorrectness of simulation results and values to detect an inappropriate global quantum, an alternative detection mechanism is described herein—the absence of expected event(s) in sequence charts.

The optimal global quantum determination tool ultimately aids the end-customer that runs a plurality of event-driven simulations for a given device/system. As an example, a particular smartphone model is in development and the smartphone developer/manufacturer creates a smartphone emulator/simulator corresponding to the smartphone model. The smartphone developer/manufacturer runs the optimal global quantum determination tool to determine a particular global quantum value that is optimal for the smartphone emulator/simulator. Even if use of the tool is an iterative process, meaning the smartphone emulator/simulator has to run a plurality of times resulting in significant total simulation time, once an optimal global quantum value is found, it need not change for future executions of the smartphone emulator/simulator. Thus, the smartphone developer/manufacturer can provide the smartphone emulator/simulator with the global quantum value set to end-customers, such as software developers. Each end-customer, in turn, can develop and test software using the provided smartphone emulator/simulator with the set global quantum value before (or instead of) actually running software on a physical smartphone. Running software on the smartphone emulator/simulator can be faster than running the same software on actual hardware. This could save software developers weeks of development and testing time. There is also no need for each end-customer to run the smartphone emulator/simulator multiple times to determine the optimal global quantum value; the smartphone developer/manufacturer has already done that for the end-customers and the global quantum setting need not be changed for the given smartphone emulator/simulator.

Thus, an overly aggressive setting for the global quantum produces incorrect simulation results, and it can also be difficult to track incorrect simulation results back to an improper global quantum setting. Conversely, an overly conservative setting for the global quantum results in slow simulation speeds without any improvement in simulation accuracy. Using a global quantum in event-driven simulations and in particular, using an optimal value of the global quantum, to allow one or more simulation components to (safely) run ahead of the simulation time is valuable. An iterative scheme to determine the optimal global quantum for each given device/system to be simulated is described herein.

Figure 7:
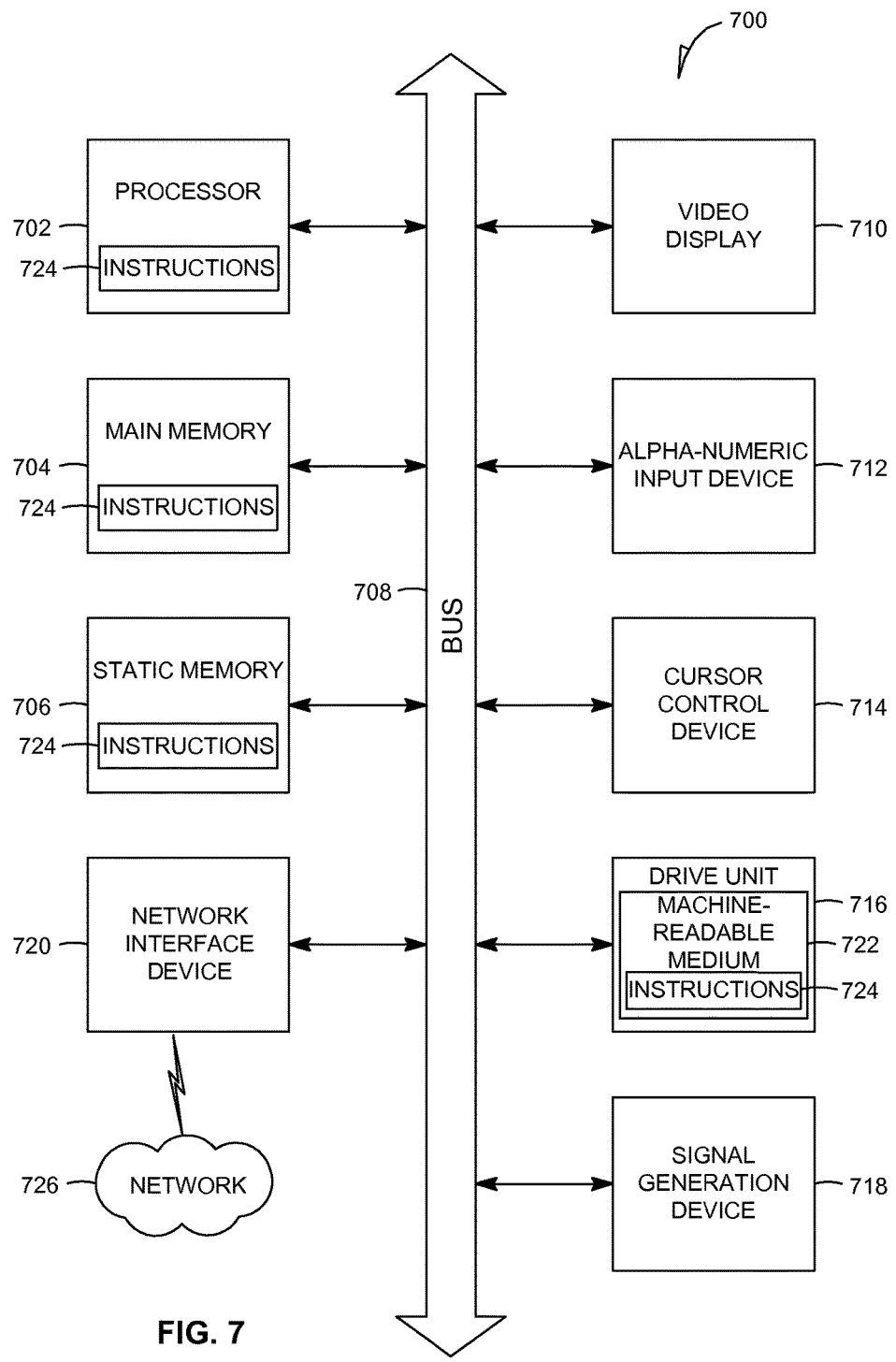
FIG. 7 shows a diagrammatic representation of a machine in the example form of a computer system within which a set of instructions are executed to cause the machine to perform any one or more of the methodologies of FIG. 5 according to some embodiments.

FIG. 7 shows a diagrammatic representation of a machine in the example form of a computer system 700 within which a set of instructions, for causing the machine to perform any one or more of the methodologies discussed herein, may be executed. The computer system 700 comprises, for example, any of the server 102, database 104, and/or clients 106. In alternative embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a server computer, a client computer, a personal computer (PC), a tablet, a set-top box (STB), a Personal Digital Assistant (PDA), a work station, a smart phone, a cellular telephone, a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 700 includes a processor 702 (e.g., a central processing unit (CPU), a graphics processing unit (GPU), or both), a main memory 704 and a static memory 706, which communicate with each other via a bus 708. The computer system 700 may further include a video display unit 710 (e.g., liquid crystal display (LCD), organic light emitting diode (OLED), touch screen, or a cathode ray tube (CRT)). The computer system 700 also includes an alphanumeric input device 712 (e.g., a physical or virtual keyboard), a cursor control device 714 (e.g., a mouse, a touch screen, a touchpad, a trackball, a trackpad), a disk drive unit 716, a signal generation device 718 (e.g., a speaker), and a network interface device 720.

The disk drive unit 716 includes a machine-readable medium 722 on which is stored one or more sets of instructions 724 (e.g., software) embodying any one or more of the methodologies or functions described herein. The instructions 724 may also reside, completely or at least partially, within the main memory 704 and/or within the processor 702 during execution thereof by the computer system 700, the main memory 704 and the processor 702 also constituting machine-readable media.

The instructions 724 may further be transmitted or received over a network 726 via the network interface device 720.

While the machine-readable medium 722 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present invention. The term "machine-readable medium" shall accordingly be taken to include, but not be limited to, solid-state memories, optical and magnetic media, and carrier wave signals.

It will be appreciated that, for clarity purposes, the above description describes some embodiments with reference to different functional units or processors. However, it will be apparent that any suitable distribution of functionality between different functional units, processors or domains may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Certain embodiments described herein may be implemented as logic or a number of modules, engines, components, or mechanisms. A module, engine, logic, component, or mechanism (collectively referred to as a "module") may be a tangible unit capable of performing certain operations and configured or arranged in a certain manner. In certain example embodiments, one or more computer systems (e.g., a standalone, client, or server computer system) or one or more components of a computer system (e.g., a processor or a group of processors) may be configured by software (e.g., an application or application portion) or firmware (note that software and firmware can generally be used interchangeably herein as is known by a skilled artisan) as a module that operates to perform certain operations described herein.

In various embodiments, a module may be implemented mechanically or electronically. For example, a module may comprise dedicated circuitry or logic that is permanently configured (e.g., within a special-purpose processor, application specific integrated circuit (ASIC), or array) to perform certain operations. A module may also comprise programmable logic or circuitry (e.g., as encompassed within a general-purpose processor or other programmable processor) that is temporarily configured by software or firmware to perform certain operations. It will be appreciated that a decision to implement a module mechanically, in dedicated and permanently configured circuitry, or in temporarily configured circuitry (e.g., configured by software) may be driven by, for example, cost, time, energy-usage, and package size considerations.

Accordingly, the term "module" should be understood to encompass a tangible entity, be that an entity that is physically constructed, permanently configured (e.g., hardwired), non-transitory, or temporarily configured (e.g., programmed) to operate in a certain manner or to perform certain operations described herein. Considering embodiments in which modules or components are temporarily configured (e.g., programmed), each of the modules or components need not be configured or instantiated at any one instance in time. For example, where the modules or components comprise a general-purpose processor configured using software, the general-purpose processor may be configured as respective different modules at different times. Software may accordingly configure the processor to constitute a particular module at one instance of time and to constitute a different module at a different instance of time.

Modules can provide information to, and receive information from, other modules. Accordingly, the described modules may be regarded as being communicatively coupled. Where multiples of such modules exist contemporaneously, communications may be achieved through signal transmission (e.g., over appropriate circuits and buses) that connect the modules. In embodiments in which multiple modules are configured or instantiated at different times, communications between such modules may be achieved, for example, through the storage and retrieval of information in memory structures to which the multiple modules have access. For example, one module may perform an operation and store the output of that operation in a memory device to which it is communicatively coupled. A further module may then, at a later time, access the memory device to retrieve and process the stored output. Modules may also initiate communications with input or output devices and can operate on a resource (e.g., a collection of information).

Although the present invention has been described in connection with some embodiments, it is not intended to be limited to the specific form set forth herein. One skilled in the art would recognize that various features of the described embodiments may be combined in accordance with the invention. Moreover, it will be appreciated that various modifications and alterations may be made by those skilled in the art without departing from the scope of the invention.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A method for use in event-driven simulations of a device to reduce costs and shorten development and manufacturing time associated with the device, the method comprising:
   simulating, using a processor, the device using information representative of a device design corresponding to the device, the simulation of the device comprising an event-driven simulation using a current provisional global quantum value, wherein a global quantum value corresponds to a maximum amount of time that one or more events are executed ahead of a system clock time;
   generating a sequence chart using a sequence chart module;
   allowing a user to visually compare events included in the sequence chart corresponding to the simulation using the current provisional global quantum value against expected events, wherein the sequence chart is configured to plot executed events and events to be executed against an axis of time for a plurality of components representative of a portion of the device being simulated during at least one of the event-driven simulations;
   based on the comparison detecting at least one of the expected events being absent in the sequence chart, determining an optimal global quantum value as being smaller than the current provisional global quantum value;
   based on the comparison detecting no difference between the events of the sequence chart and the expected events, determining the optimal global quantum value as being larger than the current provisional global quantum value; and
   providing the optimum global quantum value to a device manufacturer for emulation and manufacturing.

2. The method of claim 1, further comprising:
   based on the comparison detecting at least one of the expected events being absent in the sequence chart, decreasing the current provisional global quantum value; and
   repeating the simulating and the comparing steps each time the current provisional global quantum value is iteratively decreased until the comparison detects no difference between the events of the sequence chart and the expected events, wherein the optimal global quantum value is the current provisional global quantum value of an immediately previous iteration.

3. The method of claim 1, further comprising:
   based on the comparison detecting no difference between the events of the sequence chart and the expected events, increasing the current provisional global quantum value; and
   repeating the simulating and the comparing steps each time the current provisional global quantum value is iteratively increased until the comparison detects at least one of the expected events being absent in the sequence chart, wherein the optimal global quantum value is the current provisional global quantum value of an immediately previous iteration.

4. The method of claim 1, further comprising changing the current provisional global quantum value by an incremental value.

5. The method of claim 1, wherein the expected events are obtained performing the simulating step without a global quantum.

6. The method of claim 1, wherein the sequence chart is generated while the simulation of the device using the current provisional global quantum value is in progress, and
   wherein the simulation is halted when the comparison detects at least one of the expected events as being absent in the sequence chart.

7. The method of claim 1, wherein the simulating of the device comprises simulating a first component included in the device design corresponding to the device and simulating a second component included in the device design corresponding to the device, and
   wherein the first component is permitted to be simulated ahead of a current simulation time up to a time period of the current provisional global quantum value and the second component is not allowed to be simulated ahead of the current simulation time.

8. The method of claim 7, wherein the first component simulated ahead of the current simulation time causes the comparison to detect at least one of the expected events as being absent in the sequence chart.

9. The method of claim 8, wherein the absence of the at least one of the expected events is associated with a failure of an event notification corresponding to the absent expected event.

10. The method of claim 8, wherein the absence of the at least one of the expected events is associated with a failure of an event trigger corresponding to the absent expected event.

11. A system to reduce costs and shorten development and manufacturing time associated with an end-user device, comprising:
   a storage device encoded with information representative of a device design; and
   a computing device in communication with the storage device, the computing device configured to run an event-driven simulation with a current provisional global quantum setting using the information representative of the device design, the computing device configured to generate a sequence chart using a sequence chart module, and in the course of the simulation to, allowing a user to visually compare events included in the sequence chart corresponding to the event-driven simulation with the current provisional global quantum setting against expected events, wherein the sequence chart is configured to plot executed events and events to be executed against an axis of time for a plurality of components representative of a portion of the device being simulated during at least one of the event-driven simulations, based on the comparison detecting no missing event in the sequence chart relative to the expected events, increase the current provisional global quantum setting, and repeat the event-driven simulation using the increased current provisional global quantum setting and the comparison each time the current provisional global quantum setting is iteratively increased until the comparison detects at least one of the expected events being absent in the sequence chart, wherein an optimal global quantum setting for the event driven simulation is determined to be the current provisional global quantum setting for an immediately previous iteration, wherein a global quantum setting corresponds to a maximum amount of time that one or more events are executed ahead of a system clock time, the system configured to provide the optimum global quantum value to a device manufacturer for emulation and subsequent manufacturing.

12. The system of claim 11, wherein the computing device is configured to, based on the comparison detecting at least one of the expected events being absent in the sequence chart, decrease the current provisional global quantum setting; and repeat the event-driven simulation using the decreased current provisional global quantum setting and the comparison each time the current provisional global quantum setting is iteratively decreased until the comparison detects no difference in the events of the sequence chart relative to the expected events, wherein the optimal global quantum setting for the event driven simulation is the current provisional global quantum setting for an immediately previous iteration.

13. The system of claim 11, wherein the current provisional global quantum setting is increased by an incremental amount.

14. The system of claim 11, wherein the expected events are obtained running the event-driven simulation with a global quantum set to zero.

15. The system of claim 11, wherein the event-driven simulation comprises an Open SystemC Initiative (OSCI) SystemC transaction level modeling (TLM) 2.0 simulation environment.

16. The system of claim 11, wherein the event-driven simulation comprises a virtual platform environment.

17. The system of claim 11, wherein the event-driven simulation comprises simulating a first component included in the device design and simulating a second component included in the device design, and wherein the first component is permitted to be simulated ahead of a current simulation time up to a time period of the current provisional global quantum setting and the second component is not allowed to be simulated ahead of the current simulation time.

18. The system of claim 17, wherein the first component simulated ahead of the current simulation time causes the comparison to detect at least one of the expected events as being absent in the sequence chart.

19. A non-transitory computer readable medium including instructions, when executed by a processor, causes the processor to perform operations to reduce costs and shorten development and manufacturing time associated with an end-user device comprising:

simulating a device using information representative of a device design corresponding to the device, the simulation of the device comprising an event-driven simulation using a current provisional global quantum value, wherein a global quantum value corresponds to a maximum amount of time that one or more events are executed ahead of a system clock time;

generating a sequence chart using a sequence chart module;

allowing a user to visually compare events included in the sequence chart corresponding to the simulation using the provisional global quantum value against expected events, wherein the sequence chart is configured to plot executed events and events to be executed against an axis of time for a plurality of components representative of a portion of the device being simulated during at least one of the event-driven simulations;

based on the comparison detecting at least one of the expected events being absent in the sequence chart, decreasing the current provisional global quantum value;

repeating the simulating and the comparing steps each time the current provisional global quantum value is iteratively decreased until the comparison detects no difference between the events of the sequence chart and the expected events, wherein an optimal global quantum value is determined to be the current provisional global quantum value of an immediately previous iteration; and providing the optimum global quantum value to a device manufacturer for emulation and manufacturing.

20. The non-transitory computer readable medium of claim 19, further comprising:

based on the comparison detecting no difference between the events of the sequence chart and the expected events, increasing the current provisional global quantum value; and repeating the simulating and the comparing steps each time the current provisional global quantum value is iteratively increased until the comparison detects at least one of the expected events being absent in the sequence chart, wherein the optimal global quantum value is the current provisional global quantum value of an immediately previous iteration.

21. The non-transitory computer readable medium of claim 19, wherein the current provisional global quantum value is decreased by an incremental amount.

22. The non-transitory computer readable medium of claim 19, wherein the expected events are obtained running the event-driven simulation with the current provisional global quantum value set to zero.

23. The non-transitory computer readable medium of claim 19, wherein the simulating of the device comprises simulating a first component included in the device design corresponding to the device and simulating a second component included in the device design corresponding to the device, and wherein the first component is permitted to be simulated ahead of a current simulation time up to a time period of the current provisional global quantum value and the second component is not allowed to be simulated ahead of the current simulation time.

24. The non-transitory computer readable medium of claim 23, wherein the first component simulated ahead of the current simulation time causes the comparison to detect at least one of the expected events as being absent in the sequence chart.

* * * * *